USO11689207B1

(12) United States Patent
Bekele et al.

(10) Patent No.: US 11,689,207 B1
(45) Date of Patent: Jun. 27, 2023

(54) WIDE FREQUENCY RANGE VOLTAGE CONTROLLED OSCILLATORS

(71) Applicant: XILINX, INC., San Jose, CA (US)

(72) Inventors: Adebabay M. Bekele, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/694,550

(22) Filed: Mar. 14, 2022

(51) Int. Cl.
*H03L 7/099* (2006.01)
*H03B 5/12* (2006.01)
*H03L 7/093* (2006.01)

(52) U.S. Cl.
CPC ............ *H03L 7/099* (2013.01); *H03B 5/1253* (2013.01); *H03B 5/1296* (2013.01); *H03L 7/093* (2013.01)

(58) Field of Classification Search
CPC ....... H03L 7/099; H03L 7/093; H03B 5/1253; H03B 5/1296
See application file for complete search history.

(56) References Cited

U.S. PATENT DOCUMENTS

| 8,143,962 | B1* | 3/2012 | Atesoglu | H03B 5/1243 |
| | | | | 331/177 V |
| 10,447,283 | B1* | 10/2019 | Jung | H03L 7/087 |
| 10,715,153 | B1* | 7/2020 | Bekele | H03B 5/1228 |
| 2008/0266011 | A1* | 10/2008 | Kuosmanen | H03L 7/099 |
| | | | | 331/175 |
| 2008/0278245 | A1* | 11/2008 | Uozumi | H03L 7/199 |
| | | | | 331/17 |
| 2009/0295488 | A1* | 12/2009 | Zeng | H03B 5/1265 |
| | | | | 331/2 |
| 2010/0073051 | A1* | 3/2010 | Rao | H03L 7/1075 |
| | | | | 327/157 |
| 2012/0182078 | A1* | 7/2012 | Lee | H03B 5/1228 |
| | | | | 331/48 |
| 2012/0319787 | A1* | 12/2012 | Trivedi | H03B 5/1212 |
| | | | | 331/117 FE |

(Continued)

FOREIGN PATENT DOCUMENTS

| CN | 110417406 A | * 11/2019 | ............. H03L 7/093 |
| CN | 114785340 A | * 7/2022 | |

(Continued)

OTHER PUBLICATIONS

Hegazi, E. et al., "A filtering technique to lower LC oscillator phase noise," in IEEE Journal of Solid-State Circuits, vol. 36, No. 12, pp. 1921-1930, Dec. 2001.

*Primary Examiner* — Adam D Houston
(74) *Attorney, Agent, or Firm* — Patterson + Sheridan, LLP

(57) ABSTRACT

Phase-locked loop circuitry generates an output signal based on transformer based voltage controlled oscillator (VCO) circuitry. The VCO circuitry includes upper band circuitry including first oscillation circuitry, a first harmonic filter circuitry coupled to the first oscillation circuitry, and a first selection transistor coupled to the first harmonic filter circuitry and a current source. The first harmonic filter circuitry filters the output signal. The lower band circuitry includes second oscillation circuitry, a second harmonic filter circuitry coupled to the second oscillation circuitry, and a second selection transistor coupled to the second harmonic filter circuitry and the current source. The second harmonic filter circuitry filters the output signal.

20 Claims, 6 Drawing Sheets

(56) References Cited

U.S. PATENT DOCUMENTS

| | | | | |
|---|---|---|---|---|
| 2014/0062605 A1* | 3/2014 | Stengel | ................ | H03L 7/24 |
| | | | | 331/34 |
| 2016/0164558 A1* | 6/2016 | Elzeftawi | ............... | H03L 7/099 |
| | | | | 455/192.1 |
| 2016/0322979 A1* | 11/2016 | Upadhyaya | .............. | H04B 1/50 |
| 2020/0235745 A1* | 7/2020 | Welp | ......................... | H03L 7/22 |
| 2020/0313615 A1* | 10/2020 | Kalia | .................. | H03B 5/1215 |
| 2021/0265946 A1* | 8/2021 | Chakraborty | ....... | H03B 5/1253 |

FOREIGN PATENT DOCUMENTS

| | | | | | |
|---|---|---|---|---|---|
| DE | 102020105118 | A1 * | 10/2020 | ........... | H03B 5/1215 |
| EP | 1061661 | A2 * | 12/2000 | ........... | H04B 1/0057 |

* cited by examiner

WIDE FREQUENCY RANGE VOLTAGE CONTROLLED OSCILLATORS

TECHNICAL FIELD

Examples of the present disclosure generally relate to voltage controlled oscillators, and, more particularly, transformer based voltage controlled oscillators having harmonic filters for improved noise performance.

BACKGROUND

As technology processes scale smaller (e.g., 7 nm technology processes or less), the noise performance within corresponding systems decreases. For example, as the technology processes scale smaller, the noise performance of the transistors and power supplies of the corresponding systems decreases. Further, the area requirements of phase-locked loop (PLL) circuitries decreases. Decreasing the circuit area size of the PLL circuitries, decreases the noise performance and frequency range of the PLL circuitries, decreasing the performance of the PLL circuitries.

PLL circuitry includes one or more transformer based voltage controlled oscillator (VCO) circuitries that generate signals at specified frequencies. However, the presence of various non-linear elements within the transformer based VCO circuitries produces several harmonics within the tank current of the transformer based VCO circuitries, degrading the noise performance of the PLL circuitry and corresponding system. The non-linearity of the elements within the transformer based VCO circuitries increases as the technology processes scale smaller. Accordingly, the performance of the corresponding VCO circuitries and PLL circuitries decreases.

In the following, PLL circuitry having VCO circuitries that mitigate harmonics within the output signal of the PLL circuitry is described. The VCO circuitries include harmonic filter circuitries that filter harmonics within the output signal of the PLL circuitry, improving the performance of the PLL circuitry.

SUMMARY

Phase-locked loop (PLL) circuitries including transformer based voltage controlled oscillator (VCO) circuitries having noise reduction techniques are described herein. The transformer based VCO circuitries of the following disclosure include harmonic filter circuitries that mitigate noise within the output signals of the PLL circuitries by filtering out harmonics from tank currents within the transformer based VCO circuitries. Accordingly, the noise performance of the transformer based VCO circuitries and corresponding PLL circuitry is increased.

In one example, a transformer based VCO circuitry includes upper band circuitry and lower band circuitry. The upper band circuitry includes first oscillation circuitry, a first harmonic filter circuitry coupled to the first oscillation circuitry, and a first selection transistor coupled to the first harmonic filter circuitry and a current source. The first harmonic filter circuitry filters an output signal of the transformer based VCO circuitry. The lower band circuitry includes second oscillation circuitry, a second harmonic filter circuitry coupled to the second oscillation circuitry, and a second selection transistor coupled to the second harmonic filter circuitry and the current source. The second harmonic filter circuitry filters the output signal.

In one example, PLL circuitry includes a current source, transformer based voltage VCO circuitry. The transformer based VCO circuitry includes upper band circuitry and lower band circuitry. The upper band circuitry includes first oscillation circuitry, a first harmonic filter circuitry, and a first selection transistor coupled to the current source. The first harmonic filter circuitry is connected between the first oscillation circuitry. The first selection transistor filters an output signal of the transformer based VCO circuitry. The lower band circuitry includes second oscillation circuitry, a second harmonic filter circuitry, and a second selection transistor coupled to the current source. The second harmonic filter circuitry is connected between the second oscillation circuitry and the second selection transistor and filters the output signal.

In one example, a method includes connecting, in a first mode, upper band circuitry of transformer based VCO circuitry to a current source via a first transistor of the upper band circuitry. Further, the method includes filtering, in the first mode and via a second harmonic filter circuitry of lower band circuitry of the transformer based VCO circuitry, an output signal of the transformer based VCO circuitry by disconnecting the lower band circuitry from the current source via a second transistor of the lower band circuitry. The method further includes connecting, in a second mode, the lower band circuitry to the current source via the second transistor. Further, the method includes filtering, in the second mode and via a first harmonic filter circuitry of the upper band circuitry, the output signal of the transformer based VCO circuitry by disconnecting the upper band circuitry from the current source via the first transistor.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Communication devices include transceiver devices. The transceiver devices include phase-locked loop (PLL) circuitries that are used to generate clock signals. The PLL circuitries include voltage controlled oscillator (VCO) circuitries. The VCO circuitries may be inductance capacitance (LC) VCO circuitries. Further, the VCO circuitries are transformer based VCO circuitries. In various examples, a PLL circuitry includes multiple VCO circuitries. Accordingly, the noise performance of the PLL circuitry is based on the noise performance of the VCO circuitries.

In various instances, as the technology processes of the communication devices scale smaller, the circuit area requirements of the corresponding transformer based VCO decreases. As the circuit area of the corresponding transformer based VCO circuitries is decreased, the noise performance of the transformer based VCO circuitries decreases, decreasing the noise performance of the corresponding PLL circuitry.

In the following, transformer based VCO circuitries having improved noise performance are described. The following described transformer based VCO circuitries include harmonic filter circuitries that mitigate harmonics within the tank currents generated by the transformer based VCO circuitries, mitigating noise within the transformer based VCO circuitries and improving the noise performance of the transformer based VCO circuitries. Mitigating noise within the transformer based VCO circuitries, mitigates noise from the corresponding PLL circuitry and corresponding output signal.

Figure 1:
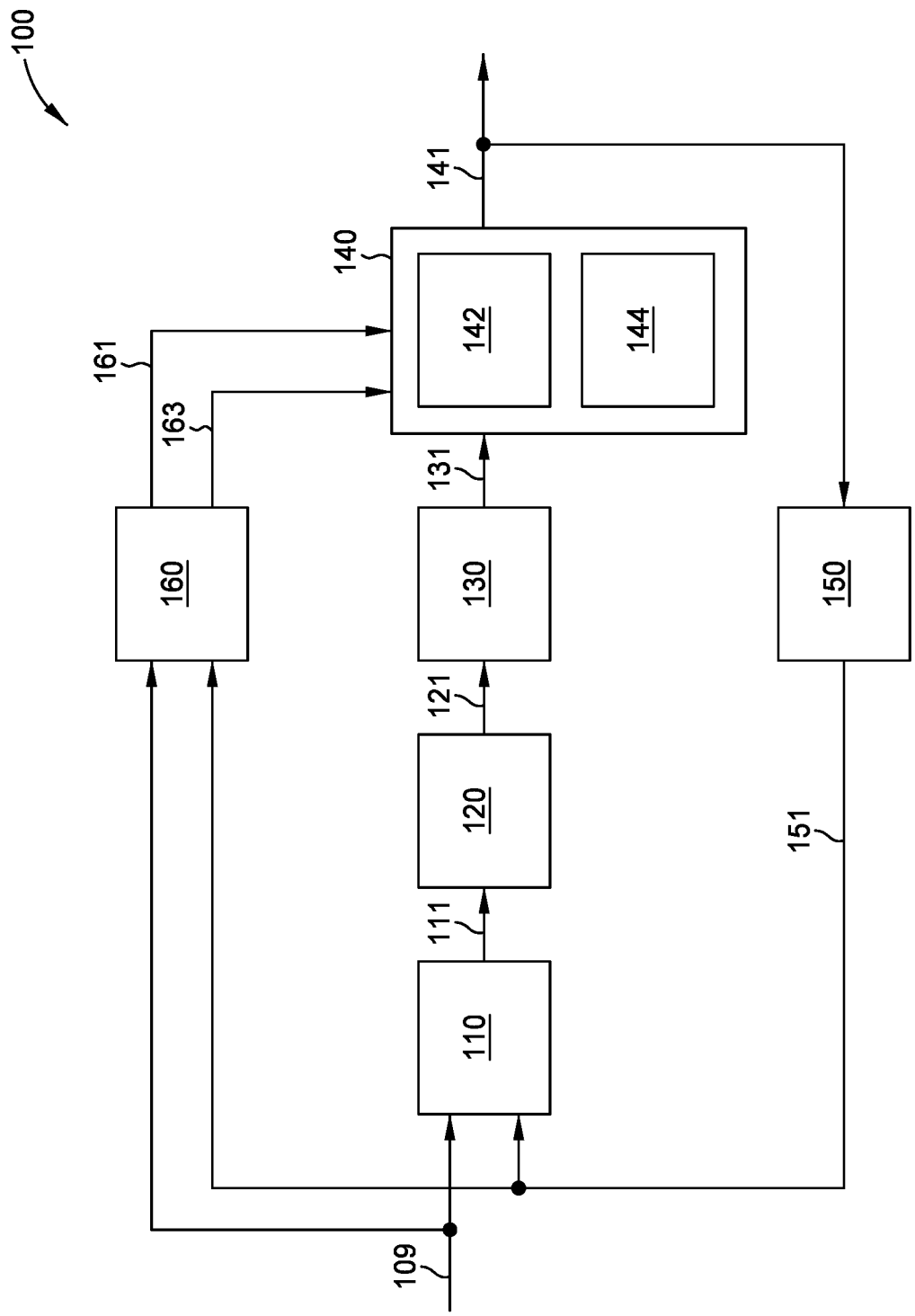
FIG. 1 is a schematic diagram of a phase-locked loop (PLL) circuitry, according to an example.

FIG. 1 is a schematic block diagram of phase-locked loop (PLL) circuitry 100, according to one or more examples. The PLL circuitry 100 may be included within an integrated circuit (IC) device. In one example, an IC device may include multiple PLL circuitries 100. In one example, the PLL circuitry 100 is included within transceiver circuitry of a communication system. For example, the PLL circuitry 100 generates an output signal (e.g., a clock signal or other signal) that is used by transceiver circuitry to transmit and/or receive data signal and other types of signals.

The PLL circuitry 100 includes phase-frequency detector (PFD) circuitry 110, charge pump circuitry 120, filter circuitry 130, transformer based voltage controlled oscillator (VCO) circuitry 140, feedback divider circuitry 150, and control circuitry 160.

The transformer based VCO circuitry 140 includes upper band (UB) circuitry 142 and lower band (LB) circuitry 144. The function of the transformer based VCO circuitry 140 is controlled based on the control signals generated by the control circuitry 160. The UB circuitry 142 has a first oscillating frequency and the LB circuitry 144 has a second oscillating frequency. The first oscillating frequency is greater than the second oscillating frequency. In one example, the first oscillating frequency is in a range of about 11 GHz to about 18 GHz, and the second oscillating frequency is in a range of about 7 GHz to about 12 GHz.

The PFD circuitry 110 receives the feedback signal 151 and a reference clock signal 109 and generates the signal 111 from the feedback signal 151 and the reference clock signal 109. The signal 111 corresponds to a phase and/or frequency difference between the reference clock signal 109 and the feedback signal 151.

The charge pump circuitry 120 generates the signal 121 from the signal 111. The signal 121 corresponds to the phase and/or frequency difference between the reference clock signal 109 and the feedback signal 151. In one example, the charge pump circuitry 120 sources or sinks a constant current depending on which frequency of the reference clock signal 109 or the feedback signal 151 is higher.

The filter circuitry 130 filters the signal 121 to generate the filtered voltage signal 131. In one example, the filter circuitry 130 is a low pass filter (LPF) that integrates the signal 121 and outputs a continuously changing control voltage for the transformer based VCO circuitry 140 as the signal 131. The filter circuitry 130 may include resistive-capacitive (RC) circuitry.

In one or more examples, once the phase different is less than 2π, the PFD circuitry 110 controls the charge pump circuitry 120 via the signal 111 such that the charge pump circuitry 120 is only active for a portion of each phase of each cycle of the PFD circuitry 110 that is proportional to the phase difference between the reference clock signal 109 and the feedback signal 151. Based on the phase difference between the reference clock signal 109 and the feedback signal 151 reaching zero, the PLL circuitry 100 may be referred to be in a phase lock state.

The feedback divider circuitry 150 is coupled to the output of the transformer based VCO circuitry 140 and receives the output signal 141 from the transformer based VCO circuitry 140. The feedback divider circuitry 150 may additionally receive one or more control signals that provide a divisor for the feedback divider circuitry 150 to use in dividing the frequency of the output signal 141. The feedback divider circuitry 150 outputs the feedback signal 151 from the output signal 141 based on the divisor of the received control signal.

The control circuitry 160 is coupled to the transformer based VCO circuitry 140, receives the reference clock signal 109 and the feedback signal 151, and outputs the control signals 161 and 163 to the transformer based VCO circuitry 140. The control circuitry 160 generates the control signals 161 and 163 from the reference clock signal 109 and the feedback signal 151.

In one or more examples, the control circuitry 160 controls parameters of the transformer based VCO circuitry 140. For example, the control circuitry 160 controls the frequency selection of the transformer based VCO circuitry 140, the operating mode of the transformer based VCO circuitry 140, and the capacitive values of the transformer based VCO circuitry 140 based on the reference clock signal 109 and the feedback signal 151. The control circuitry 160 generates a control signal 161 and the control signal (e.g., a VCO select signal) 163. The control signal 161 controls the oscillating frequency of the UB circuitry 142 and the LB circuitry 144.

The control signal 161 controls the capacitance values (e.g., the value of the capacitor array) of the UB circuitry 142 and the capacitance values (e.g., the value of the capacitor array) of the LB circuitry 144. Controlling the capacitance values of the UB circuitry 142 and LB circuitry 144 adjusts the oscillating frequency (e.g., operating frequency) of the transformer based VCO circuitry 140.

The control signal 163 controls which of the UB circuitry 142 and the LB circuitry 144 is active. The control signal 163 controls the operating mode (e.g., mode-0 and mode-1) of the transformer based VCO circuitry 140. Further, controlling which of the UB circuitry 142 and the LB circuitry 144 is active selects the operating mode of the transformer based VCO circuitry 140. The operating mode corresponds to the oscillating frequency (e.g., the operating frequency) of the transformer based VCO circuitry 140. For example, the transformer based VCO circuitry 140 may oscillate at an upper frequency (e.g., a first frequency), and a lower frequency (e.g., a second frequency). In one example, in the first operating mode (e.g., mode-0), the output signal 141 is generated based on the oscillating frequency of the UB circuitry 142. Further, in the second operating mode (e.g., mode-1), the output signal 141 is generated based on the oscillating frequency of the LB circuitry 144.

Figure 2:
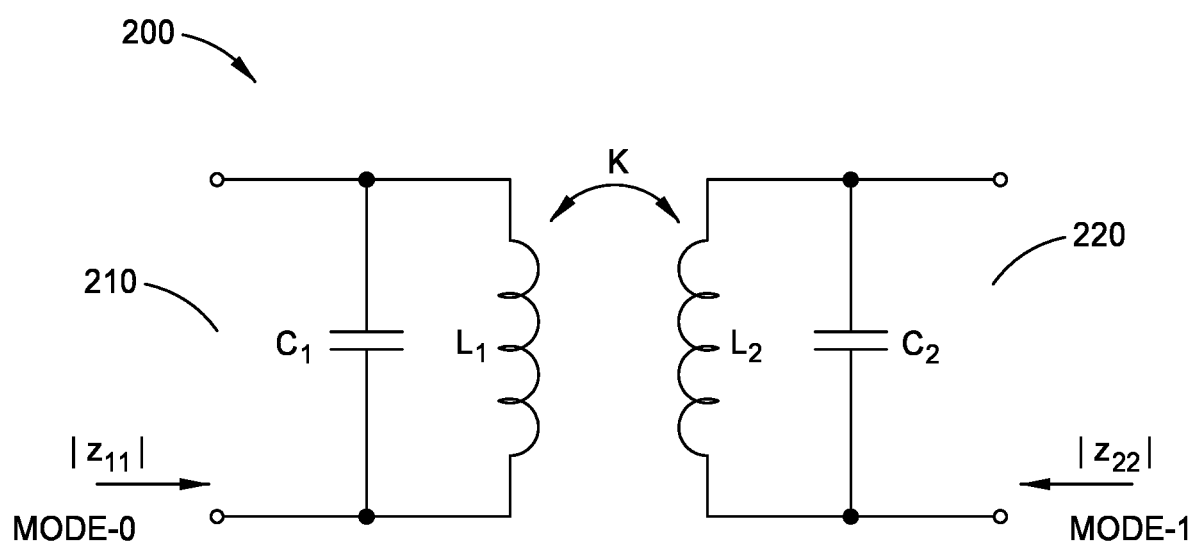
FIG. 2 is a schematic circuit diagram illustrating an impedance of inductors of transformer based voltage controlled oscillator circuitry, according to an example.

FIG. 2 illustrates a block diagram showing the impedance of the inductors of the transformer based VCO circuitry 200, according to one or more examples. The VCO circuitry 200 is a transformer having a K factor. In one example, inductor L1 and capacitor C1 correspond to upper band VCO circuitry 210 (e.g., the UB circuitry 142), and the inductor 12 and capacitor C2 correspond to lower band VCO circuitry 220 (e.g., the LB circuitry 144 of FIG. 1). The ratio of L1C1/L2C2 determines the frequency peaks |z11| and |z22| of the operating modes (e.g., the first operating mode (mode-1), and the second operating mode (mode-0)), respectively.

In one or more examples, the thermal phase noise in LC VCO circuitries can be approximated based on equation 1.

$$\mathcal{L}(\omega_m) = \frac{4FkTR}{V_O^2}\left(\frac{\omega_0}{2Q\omega_m}\right)^2 \quad \text{Equation 1}$$

The noise factor F is determined based on equation 2.

$$F = 2 + \frac{8\gamma R\omega I_T}{\Pi V_O} + \frac{8}{9}\gamma g_{mbias}R \quad \text{Equation 2}$$

Noise may be introduced within a transformer based VCO circuitry (e.g., the UB circuitry 142 and the LB circuitry 144). For example, noise is injected into the LC tank of the VCO circuitry. The LC tank is formed by the capacitance and inductance of the VCO circuitry. In one example, the UB circuitry 142 of FIG. 1 and the LB circuitry 144 of FIG. 1 up or down converts, respectively, noise within corresponding VCO circuitry. In one or more examples, the performance of the VCO circuitry is affected by two noise frequencies as other noise frequencies are filtered out by the bandpass nature of the VCO circuitry. The first noise frequency that negatively affects the operation of the VCO circuitry corresponds to flicker noise and is a low frequency. The second noise frequency that negatively affects the operation of the VCO circuitry corresponds to thermal noise and has a high frequency, higher than that associated with flicker noise.

Figure 3:
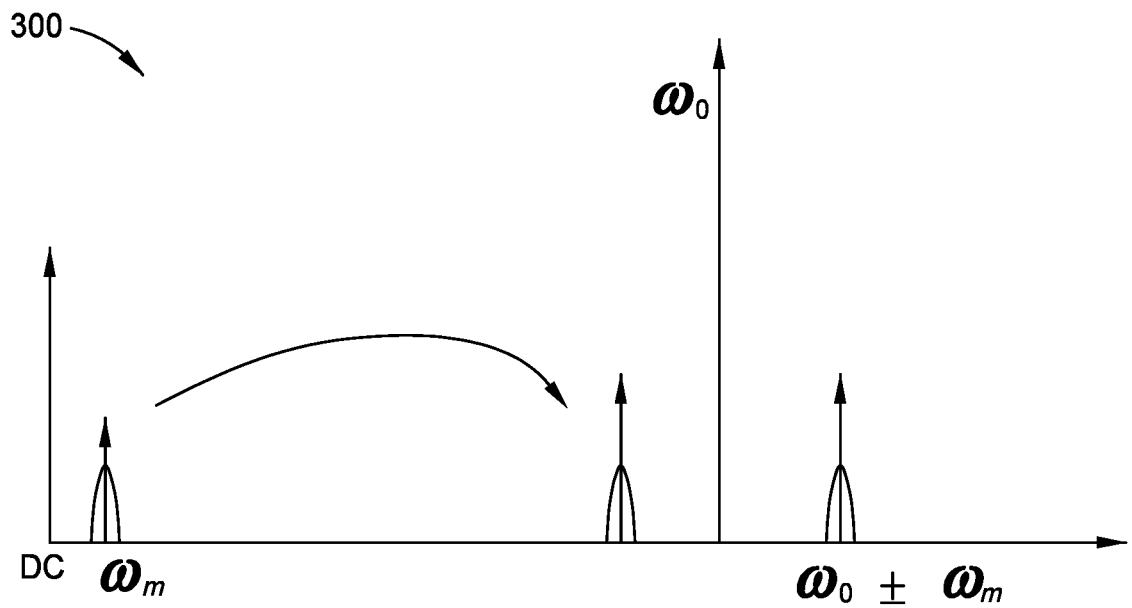
FIG. 3 depicts a graph corresponding to noise of transformer based voltage controlled oscillator circuitry, according to an example.
Figure 4:
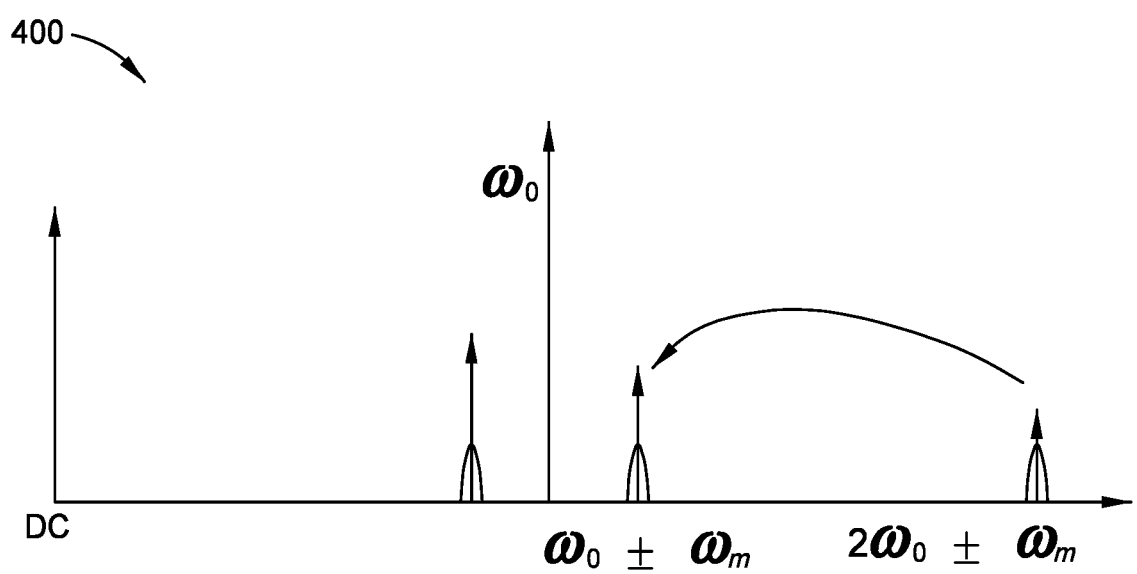
FIG. 4 depicts a graph corresponding to noise of transformer based voltage controlled oscillator circuitry, according to an example.

Flicker noise is about frequency $\omega_m$ and is up converted to frequency $\omega_m \pm \omega_0$ as illustrated by the graph 300 of FIG. 3. Flicker noise is translated into amplitude modulation which is converted into phase modulation by the varactors (e.g., variable capacitors) of a transformer based VCO circuitry, and other non-linear elements within the transformer based VCO circuitry. As the amplitude of the flicker noise increases, non-linearities within the transformer based VCO circuitry may cause harmonic distortions making up-conversion of the flicker noise a limiting factor in the operation of the transformer based VCO circuitry. As is illustrated by the graph 400 of FIG. 4, the thermal noise, $\omega_m$, has a frequency of about $2\omega_0$. The thermal noise can be down converted to be about the oscillation frequency, $\omega_m \pm \omega_{02}$. In one example, the bandwidth of the harmonic filter is about $2\omega_0$.

As is described in the following, to mitigate the effects of the flicker noise and thermal noise, the transformer based VCO circuitry includes harmonic filter circuitries that filter and reject harmonic distortion, improving the performance of the transformer based VCO circuitry.

Figure 5:
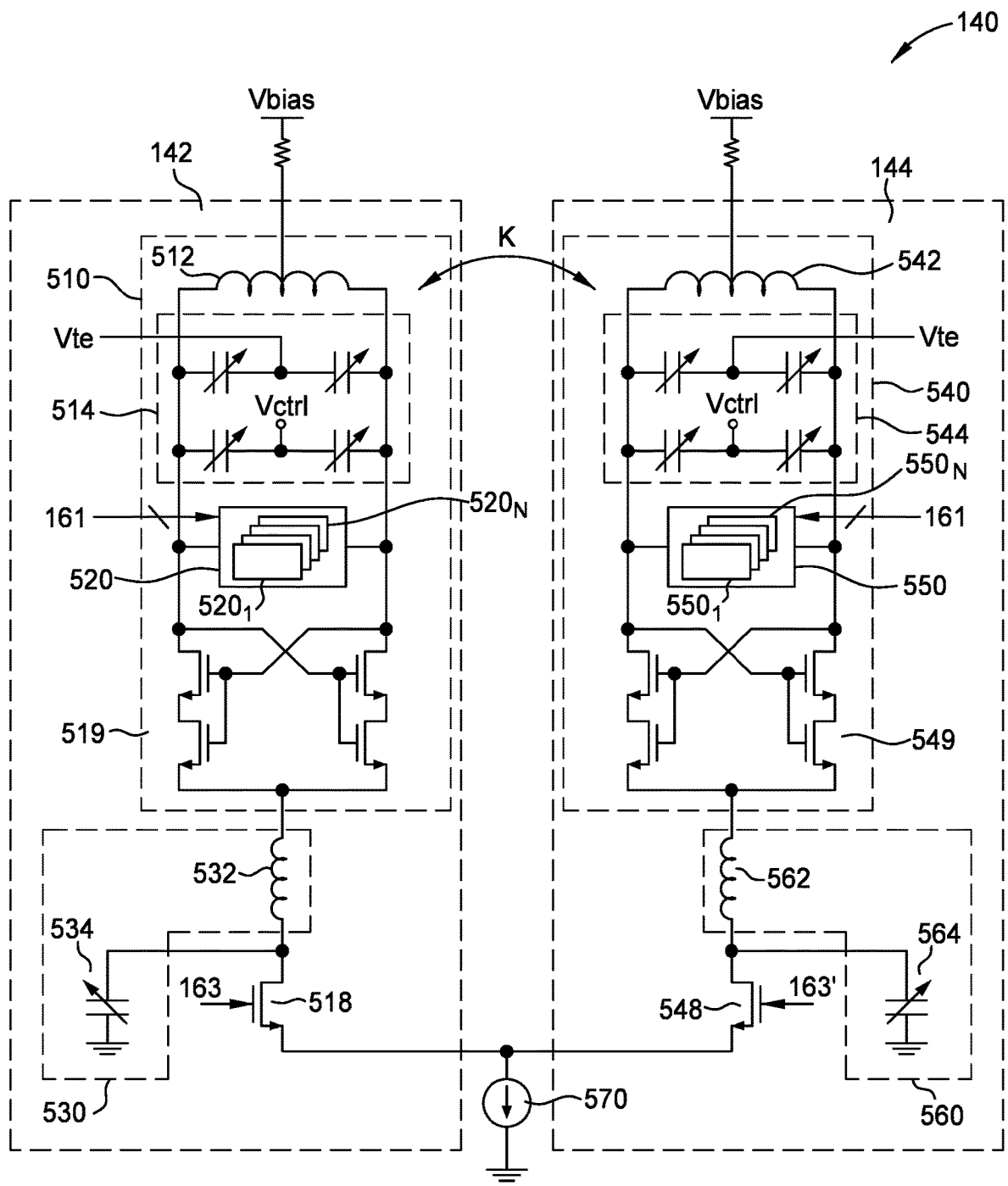
FIG. 5 depicts a circuit diagram of transformer based voltage controlled oscillator circuitry, according to an example.

FIG. 5 illustrates a circuit diagram of the transformer based VCO circuitry 140, according to one or more examples. The transformer based VCO circuitry 140 includes the UB circuitry 142 and the LB circuitry 144. As is described above with regard to FIG. 1, the transformer based VCO circuitry 140 receives the control signals 161 and 163. Further, transformer based VCO circuitry 140 receives the voltage signals Vbias, Vte, and Vctl. The voltage signals Vbias and Vte are provided by one or more power supply devices, e.g., a voltage regulator or another power supply device. The voltage signal Vctl may be the signal 131 provided by the filter circuitry 130 of FIG. 1. The transformer based VCO circuitry 140 includes the UB circuitry 142 and the LB circuitry 144. The coupling coefficient K is formed between the UB VCO circuitry 142 and the LB circuitry 144.

The UB circuitry 142 includes oscillation circuitry 510, harmonic filter circuitry 530, and the selection transistor 518. The oscillation circuitry 510 includes inductor 512, varactors 514, and capacitor array (e.g., a capacitor DAC) 520. The inductor 512 is coupled in parallel with the varactors 514 and the capacitor array 520. The UB circuitry 142 is connected to a voltage node via a resister to receive the voltage signal Vbias. The varactors 514 include one or more varactors disposed between a first and second node the UB circuitry 142 and in parallel with the inductor 512. The capacitance of the varactors 514 is variable such that a capacitance of the varactors 514 may be selected and controlled. The oscillating signal generated across the first and second nodes of the varactors 514 corresponds to the capacitance of the varactors 514.

The capacitor array 520 includes capacitor units 5201-520N. The capacitor array 520 receives the control signal 161. The control signal 161 includes multiple bits. In one example, the control signal 161 is provided via a bus. Each of the capacitor units 5201-520N receives a bit of the control of the control signal 161. Each of the capacitor units 5201-520N may be individually controlled via a respective bit of the control signal 161. For example, a capacitor unit 5201-520N may be selectively turned on or turned off (e.g., connected or disconnected), adjusting the capacitance of the UB circuitry 142, and adjusting the oscillating frequency of the UB circuitry 142.

The oscillation circuitry 510 further includes cross-coupled transistors 519 coupled between the capacitor array 520 and the harmonic filter circuitry 530. The harmonic filter circuitry 530 functions as a bandstop filter. In one example, the harmonic filter circuitry 530 may be referred to as being connected to the tail node of the UB circuitry 142. In one or more examples, the harmonic filter circuitry 530 removes even harmonics from the output of the transformer based VCO circuitry 140. In one specific example, the harmonic filter circuitry 530 removes second order harmonics from the output of the transformer based VCO circuitry 140.

The harmonic filter circuitry 530 includes the inductor 532 and the capacitance 534. The inductor 532 is in series with the capacitance 534. The capacitance 534 may be a variable capacitance. In one example, the capacitance 534 is a parasitic capacitance of the selection transistor 518. In another example, the capacitance 534 is the capacitance of a discrete capacitor connected in series with the inductor 532 and a ground node. The inductance value of the inductor 532 is $I_a$ and the capacitance value of the capacitance 534 is $C_a$. The value of $C_a I_a$ is selected such that the harmonic filter circuitry 530 resonates at $2\omega_0$ in mode-1. In mode-1, the LB circuitry 144 is selected (e.g., connected to the current source 570) by the control signal 163' and the UB circuitry 142 is de-selected (e.g., disconnected from the current source 570) by the control signal 163. In mode-1, the harmonic filter circuitry 530 functions in a frequency range of about two times the range of the bandwidth of the LB circuitry 144, In one example, the range is about 14 GHz and 24 GHz, removing even harmonics from the output signal (e.g., the output signal 141 of FIG. 1) of the transformer based VCO circuitry 140. In one or more examples, the inductance $I_a$ of the inductor 532 of the harmonic filter circuitry 530 is selected such that the inductor 532 resonates in parallel with the capacitance 534 in a range of about two times the range of the bandwidth of the LB circuitry 144 frequencies between about 14 GHz and about 24 GHz.

The selection transistor 518 is coupled to the current source 570. The selection transistor 518 controls the connection between the UB circuitry 142 and the current source 570 based on the VCO select signal 163. In one example, based on the VCO select signal 163 having a high voltage value (e.g., a logic value of 1), the selection transistor 518 connects the UB circuitry 142 with the current source 570, turning on the UB circuitry 142. Further, based on the VCO select signal 163 having a low voltage value (e.g., a logic value of 0), the selection transistor 518 disconnects the UB circuitry 142 from the current source 570, turning off the UB circuitry 142. The control signal 163 having a high voltage value corresponds to the mode-0.

The LB circuitry 144 includes oscillation circuitry 540, harmonic filter circuitry 560, and selection transistor 548. The oscillation circuitry 540 includes inductor 542, varactors 544, and capacitor array 550. The inductor 542 is in parallel with the varactors 544 and the capacitor array 550. The LB circuitry 144 is connected to a voltage node via a resistor to receive the voltage signal Vbias. The varactors 544 include one or more varactors disposed between a first and second node the LB circuitry 144 and in parallel with the inductor 542. The capacitance of the varactors 544 is variable such that a capacitance of the varactors 544 may be selected and controlled. The oscillating signal generated across the first and second nodes of the varactors 544 corresponds to the capacitance of the varactors 544.

The capacitor array 550 includes capacitor units 5501-550N. The capacitor array 550 receives the control signal 161. The control signal 161 includes multiple bits. In one example, the control signal 161 is provided via a bus. Each of the capacitor units 5501-550N receives a bit of the control of the control signal 161. Each of the capacitor units 5501-550N may be individually controlled via a respective bit of the control signal 161. For example, the capacitor units 5501-550N are selectively turned on or turned off (e.g., connected or disconnected), adjusting the capacitance of the LB circuitry 144, and adjusting the oscillating frequency of the LB circuitry 144.

The LB circuitry 144 further includes cross-coupled transistors 549 coupled between the capacitor array 550 and the harmonic filter circuitry 560. The harmonic filter circuitry 560 functions as a bandstop filter. In one example, the harmonic filter circuitry 560 may be referred to as being connected to the tail node of the LB circuitry 144. In one or more examples, the harmonic filter circuitry 560 removes even harmonics from the output of the transformer based VCO circuitry 140.

The harmonic filter circuitry 560 includes the inductor 562 and the capacitance 564. The inductor 562 is in series with the capacitance 564. The capacitance 564 may be a variable capacitance. In one example, the capacitance 564 is a parasitic capacitance of the selection transistor 548. In another example, the capacitance 564 is the capacitance of a discrete capacitor connected in series with the inductor 562. The inductance value of the inductor 562 is $I_b$ and the capacitance value of the capacitance 564 is $C_b$. The value of $C_b I_b$ is selected such that the harmonic filter circuitry 560 resonates at $2\omega_0$ in mode-0. In mode-0, the UB circuitry 142 is selected (e.g., connected to the current source 570) by the control signal 163 and the LB circuitry 144 is de-selected (e.g., disconnected from the current source 570) by the control signal 163'. The inductance $I_b$ of the inductor 562 of harmonic filter circuitry 560 is selected such that the inductor 562 resonates in parallel with the capacitance 564 between about 22 GHz and about 36 GHz.

The selection transistor 548 is coupled to the current source 570. The selection transistor 548 controls the connection between the LB circuitry 144 and the current source 570 based on the inverted VCO select signal 163'. In one example, based on the inverted VCO select signal 163' having a high voltage value (e.g., a logic value of 1), the selection transistor 548 connects the LB circuitry 144 with the current source 570, turning on the UB circuitry 144. Further, based on the inverted VCO select signal 163' having a low voltage value (e.g., a logic value of 0), the selection transistor 548 disconnects the LB circuitry 144 from the current source 570, turning off the LB circuitry 144.

In one example, the value of the inductance $I_a$ and the value of the inductance $I_b$ are the same. In another example, the value of the inductance $I_a$ is greater than the value of the inductance $I_b$. In yet another example, the value of the inductance $I_b$ is greater than the value of the inductance $I_a$. Further, in one example, the value of the capacitance $C_a$ is greater than or less than the value of the capacitance $C_b$. In one example, the value of the inductance $I_a$ is the same as the value of the inductance $I_b$, and the value of the capacitance $C_a$ is greater than or less than the value of the capacitance $C_b$.

In one or more examples, the VCO select signal 163 and the inverted VCO select signal 163' have an opposite polarity. For example, in mode-0 when the VCO select signal 163 has a high voltage value, the inverted VCO select signal has a low voltage value. Further, in mode-1 when the VCO select signal 163 has a low voltage value, the inverted VCO select signal has a high voltage value. Accordingly, in mode-0 the UB circuitry 142 is turned on and connected to the current source 570, and the LB circuitry 144 is turned off and disconnected from the current source 570. Further, in mode-1 the LB circuitry 144 is turned on and connected to the current source 570, and the UB circuitry is turned off and disconnected from the current source 570.

In one or more examples, the behavior of the harmonic filter circuitry circuitries 530 and 560 varies depending on the mode of operation, e.g., mode-0 or mode-1. For example, when in mode-0, the control signal 163 is asserted to a high voltage value (e.g., has a logic value of 1) and the harmonic filter circuitry 560 performs filtering of even order harmonics (e.g., the second order harmonics among others). Accordingly, in mode-0, the UB circuitry 142 is selected (e.g., connected to the current source 570). Further, when mode-1, the control signal 163' is asserted to a high voltage value (e.g., has a logic value of 1), and the harmonic filter circuitry 530 performs filtering of the even order harmonic (e.g., the second order harmonic, among others).

With reference to FIG. 5, in mode-0, the UB circuitry 142 is connected to the current source 570 and the LB circuitry 144 filters even order harmonics generated by the UB circuitry 142. Further, in mode-1, the LB circuitry 144 is connected to the current source 570, and the UB circuitry 142 filters even order harmonics generated by the LB circuitry 144. Accordingly, noise within the transformer based VCO circuitry 140 is mitigated, improving the noise performance of the transformer based VCO circuitry 140. In one example, the noise performance is improved by about 3 dB, as compared VCO circuitries that do not include harmonic filter circuitries.

In one or more examples, a feedback system may be used to adjust, or tune, $C_a$ and/or $C_b$ to track process, voltage, and temperature (PVT) variations within the transformer based VCO circuitry 140. In one example, the feedback system tracks changes to the capacitor array 520 and/or the capacitor array 550.

Figure 6:
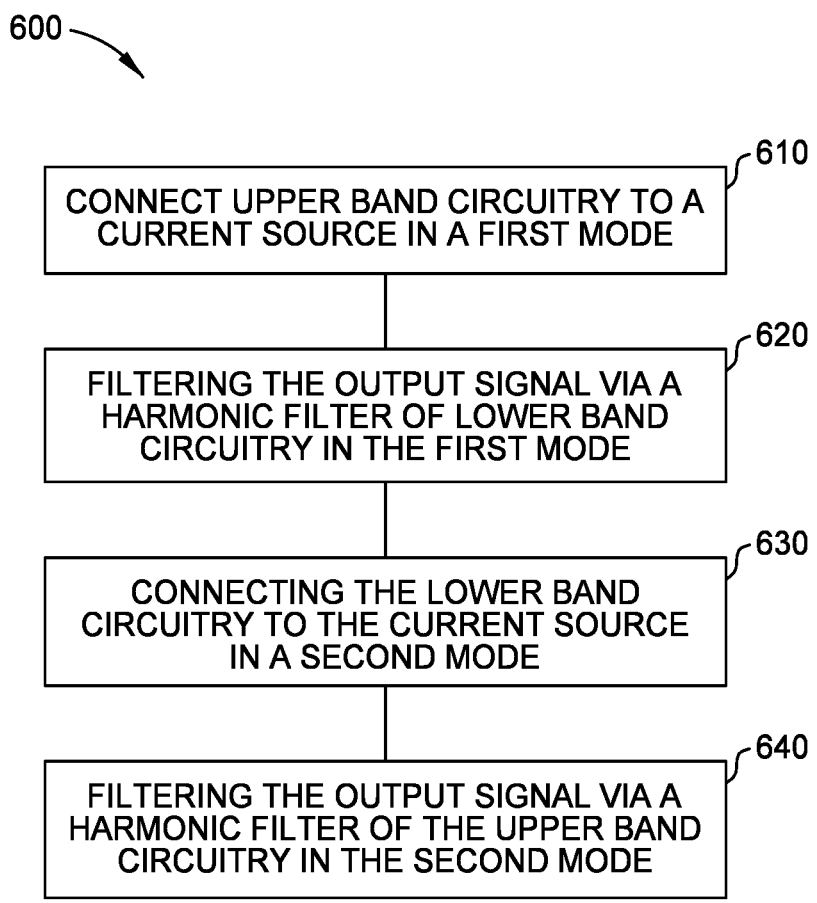
FIG. 6 is a flowchart of a method for operating transformer based voltage controlled oscillator circuitry, according to an example.

FIG. 6 illustrates a flowchart of a method 600 for filtering an output signal of PLL circuitry, according to one or more examples. At 610 of the method 600, first VCO circuitry of PLL circuitry is connected to a current source in a first mode. For example, with reference to FIG. 5, the selection transistor 518 of the UB circuitry 142 connects the UB circuitry 142 to the current source 570 based on the control signal 163. For example, based on the control signal 163 having a logic value of 1 (e.g., a high voltage value), the selection transistor 518 connects the UB circuitry 142 to the current source 570. Accordingly, the output signal (e.g., the output signal 141 of FIG. 1) of the corresponding PLL circuitry (e.g., the PLL circuitry 100) and the VCO circuitry (e.g., the transformer based VCO circuitry 140 of FIG. 1) is generated based on the oscillating frequency of the UB circuitry 142. The first mode corresponds to mode-0 as is described above.

At 620 of the method 600, the output signal of the PLL circuitry is filtered via a harmonic filter circuitry of second VCO circuitry of the PLL circuitry in the first mode. For example, with reference to FIG. 5, the harmonic filter circuitry 560 of the LB circuitry 144 filters the output signal (e.g., the output signal 141) in the first mode (e.g., mode-0). In one example, in mode-0 the selection transistor 548 disconnects the LB circuitry 144 from the current source 570 based on the control signal 163' having a logic value of 0 (e.g., a low voltage value). Based on disconnecting the LB circuitry 144 from the current source 570, the harmonic filter circuitry 560 removes second order harmonics from the output signal (e.g., the output signal 141).

At 630 of the method 600, second VCO circuitry of PLL circuitry is connected to the current source in a second mode. For example, with reference to FIG. 5, the selection transistor 548 of the LB circuitry 144 connects the LB circuitry 144 to the current source 570 based on the control signal 163'. For example, based on the control signal 163' having a logic value of 1 (e.g., a high voltage value), the selection transistor 548 connects the LB circuitry 144 to the current source 570. Accordingly, the output signal (e.g., the output signal 141 of FIG. 1) of the corresponding PLL circuitry (e.g., the PLL circuitry 100) and the VCO circuitry (e.g., the transformer based VCO circuitry 140 of FIG. 1) is generated based on the oscillating frequency of the LB circuitry 144. The second mode corresponds to mode-1 as is described above.

At 640 of the method 600, the output signal of the PLL circuitry is filtered via a harmonic filter circuitry of first VCO circuitry of the PLL circuitry in the second mode. For example, with reference to FIG. 5, the harmonic filter circuitry 530 of the UB circuitry 142 filters the output signal (e.g., the output signal 141) in the second mode (e.g., mode-1). In one example, in mode-1 the selection transistor 518 disconnects the UB circuitry 142 from the current source 570 based on the control signal 163 having a logic value of 0 (e.g., a low voltage value). Based on disconnecting the UB circuitry 142 from the current source 570, the harmonic filter circuitry 530 removes second order harmonics from the output signal (e.g., the output signal 141).

Figure 7:
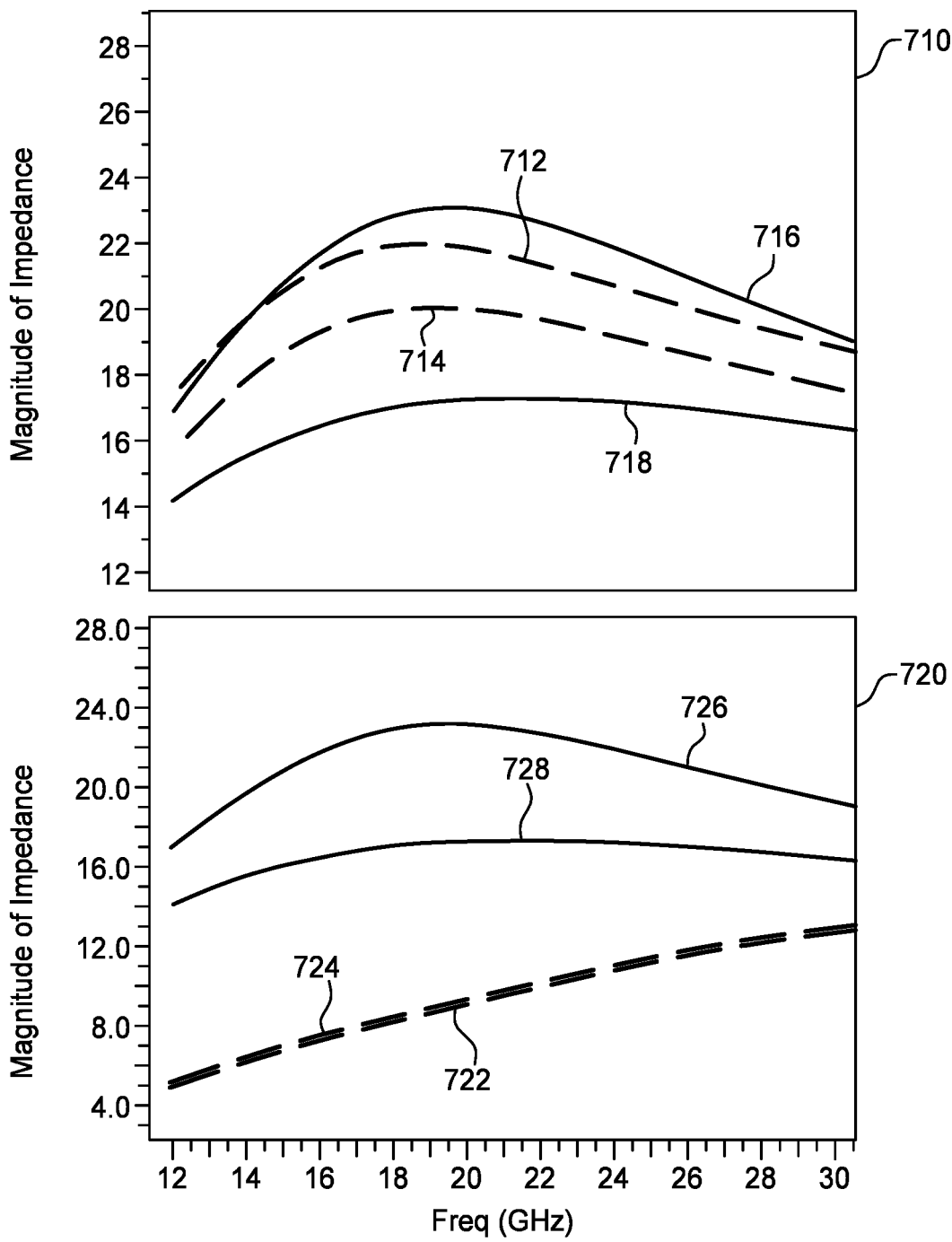
FIG. 7 depicts graphs illustrating the magnitude of impedance of transformer based voltage controlled oscillator circuitry.

FIG. 7 depicts the graphs 710 and 720 illustrating the magnitude of impedance of a transformer based VCO circuitry with reference to the operating frequency. As illustrated in FIG. 7, the traces 712 and 714 illustrate the magnitude of impedance of the upper and lower band circuitries of the transformer based VCO circuitry (e.g., the transformer based VCO circuitry 140 of FIG. 5) when operating in mode 0. The upper and lower band circuitries of the transformer based VCO circuitry include harmonic filter circuitries. The traces 716 and 718 illustrate the magnitude of impedance of the upper and lower band circuitries of the transformer based VCO circuitry when operating in mode 1. In the graph 720, the traces 722 and 724 illustrate the magnitude of impedance of the upper and lower band circuitries of the transformer based VCO circuitry not having harmonic filter circuitries when operating in mode 0. The traces 726 and 728 illustrate the magnitude of impedance of the upper and lower band circuitries of the transformer based VCO circuitry not having harmonic filter circuitries when operating in mode 1. As can be seen be seen, in the graph 710, the magnitude of impedance of mode 0 is greater than that in graph 720. Accordingly, the ability for transformer based VCO circuitry to filter noise when implementing harmonic filters is higher than a transformer based VCO circuitry that does not implement harmonic filters.

As is described above, UB circuitry and LB circuitry of transformer based VCO circuitry include harmonic filter circuitry. Accordingly, in a first mode when the output signal of the PLL circuitry is generated based on the oscillating frequency of the UB circuitry, the harmonic filter circuitry of the LB circuitry harmonically filters the output signal of the PLL circuitry. In a second mode when the output signal of the PLL circuitry is generated based on the oscillating frequency of the LB circuitry, the harmonic filter circuitry of the UB circuitry harmonically filters the output signal of the PLL circuitry. In one example, harmonically filtering the output signal includes removing second order harmonics from the output signal of the PLL circuitry. Harmonically filtering the output signal, improves the noise performance of the PLL circuitry allowing for smaller circuit area transformer based VCO circuitries to be used, reducing the cost and improving the performance of the PLL circuitries.

While the foregoing is directed to specific examples, other and further examples may be devised without departing from the basic scope thereof, and the scope thereof is determined by the claims that follow.

What is claimed is:

1. A transformer based voltage controlled oscillator (VCO) circuitry comprising:
   upper band circuitry comprising first oscillation circuitry, a first harmonic filter circuitry coupled to the first oscillation circuitry, and a first selection transistor coupled to the first harmonic filter circuitry and a current source, wherein the first harmonic filter circuitry is configured to filter an output signal of the transformer based VCO circuitry; and lower band circuitry comprising second oscillation circuitry, a second harmonic filter circuitry coupled to the second oscillation circuitry, and a second selection transistor coupled to the second harmonic filter circuitry and the current source, wherein the second harmonic filter circuitry is configured to filter the output signal.

2. The transformer based VCO circuitry of claim 1, wherein the first harmonic filter circuitry comprises a first inductor and a first capacitance.

3. The transformer based VCO circuitry of claim 2, wherein the first capacitance is a parasitic capacitance of the first selection transistor.

4. The transformer based VCO circuitry of claim 2, wherein the second harmonic filter circuitry comprises a second inductor and a second capacitance.

5. The transformer based VCO circuitry of claim 4, wherein the second capacitance is a parasitic capacitance of the second selection transistor.

6. The transformer based VCO circuitry of claim 1, wherein, in a first operating mode, the first selection transistor is configured to disconnect the upper band circuitry from current source and the second selection transistor is configured to connect the lower band circuitry to the current source, and wherein, in the first operating mode, the first harmonic filter circuitry is configured to filter second harmonics in the output signal.

7. The transformer based VCO circuitry of claim 1, wherein, in a second operating mode, the second selection transistor is configured to disconnect the lower band circuitry from current source, and the first selection transistor is configured to connect the upper band circuitry to the current source, and wherein, in the second operating mode, the second harmonic filter circuitry is configured to filter second harmonics in the output signal.

8. A phase-locked loop (PLL) circuitry comprising:
a current source; and
transformer based voltage control oscillator (VCO) circuitry comprising:
upper band circuitry comprising first oscillation circuitry, a first harmonic filter circuitry, and a first selection transistor coupled to the current source, the first harmonic filter circuitry is connected between the first oscillation circuitry, and the first selection transistor is configured to filter an output signal of the transformer based VCO circuitry; and
lower band circuitry comprising second oscillation circuitry, a second harmonic filter circuitry, and a second selection transistor coupled to the current source, the second harmonic filter circuitry is connected between the second oscillation circuitry, and the second selection transistor and is configured to filter the output signal.

9. The PLL circuitry of claim 8, wherein the first harmonic filter circuitry comprises a first inductor and a first capacitance.

10. The PLL circuitry of claim 9, wherein the first capacitance is a parasitic capacitance of the first selection transistor.

11. The PLL circuitry of claim 9, wherein the second harmonic filter circuitry comprises a second inductor and a second capacitance.

12. The PLL circuitry of claim 11, wherein the second capacitance is a parasitic capacitance of the second selection transistor.

13. The PLL circuitry of claim 8, wherein, in a first operating mode, the first selection transistor is configured to disconnect the upper band circuitry from current source and the second selection transistor is configured to connect the lower band circuitry to the current source, and wherein, in the first operating mode, the first harmonic filter circuitry is configured to filter second harmonics in the output signal.

14. The PLL circuitry of claim 8, wherein, in a second operating mode, the second selection transistor is configured to disconnect the upper band circuitry from current source, and the first selection transistor is configured to connect the lower band circuitry to the current source, and wherein, in the second operating mode, the second harmonic filter circuitry is configured to filter second harmonics in the output signal.

15. A method comprising:
connecting, in a first mode, upper band circuitry of transformer based voltage controlled oscillator (VCO) circuitry to a current source via a first transistor of the upper band circuitry;
filtering, in the first mode and via a second harmonic filter circuitry of lower band circuitry of the transformer based VCO circuitry, an output signal of the transformer based VCO circuitry by disconnecting the lower band circuitry from the current source via a second transistor of the lower band circuitry;
connecting, in a second mode, the lower band circuitry to the current source via the second transistor; and
filtering, in the second mode and via a first harmonic filter circuitry of the upper band circuitry, the output signal of the transformer based VCO circuitry by disconnecting the upper band circuitry from the current source via the first transistor.

16. The method of claim 15, wherein harmonically filtering the output signal of the transformer based VCO circuitry comprises filtering second harmonics of the output signal of the transformer based VCO circuitry.

17. The method of claim 15, wherein the first harmonic filter circuitry comprises a first inductor and a first capacitance.

18. The method of claim 17, wherein the first capacitance is a parasitic capacitance of the first transistor.

19. The method of claim 17, wherein the second harmonic filter circuitry comprises a second inductor and a second capacitance.

20. The method of claim 19, wherein the second capacitance is a parasitic capacitance of the second transistor.

* * * * *